(12) United States Patent
Nie (10) Patent No.: US 11,894,391 B2
(45) Date of Patent: Feb. 6, 2024

(54) CONTACT RESISTANCE MONITORING DEVICE, MANUFACTURING METHOD THEREOF, AND DISPLAY PANEL

(71) Applicant: WUHAN CHINA STAR OPTOELECTRONICS TECHNOLOGY CO., LTD, Wuhan (CN)

(72) Inventor: Xiaohui Nie, Wuhan (CN)

(*) Notice: Subject to any disclaimer, the term of this patent is extended or adjusted under 35 U.S.C. 154(b) by 772 days.

(21) Appl. No.: 16/970,653

(22) PCT Filed: Jul. 8, 2020

(86) PCT No.: PCT/CN2020/100856
§ 371 (c)(1),
(2) Date: Aug. 18, 2020

(87) PCT Pub. No.: WO2021/223320
PCT Pub. Date: Nov. 11, 2021

(65) Prior Publication Data
US 2023/0138833 A1 May 4, 2023

(30) Foreign Application Priority Data
May 7, 2020 (CN) .......................... 202010376730.7

(51) Int. Cl.
*H01L 27/12* (2006.01)
*G01R 27/02* (2006.01)

(52) U.S. Cl.
CPC .......... *H01L 27/124* (2013.01); *G01R 27/02* (2013.01); *H01L 27/1259* (2013.01)

(58) Field of Classification Search
CPC ... H01L 27/124; H01L 27/1259; H01L 22/34; H01L 27/1214; H01L 27/1244; G01R 27/02
See application file for complete search history.

(56) References Cited

U.S. PATENT DOCUMENTS

| | | | |
|---|---|---|---|
| 2010/0244032 A1 | 9/2010 | Yun et al. | |
| 2014/0086791 A1 | 3/2014 | Okuno et al. | |
| 2015/0279257 A1 | 10/2015 | Fu | |
| 2017/0194219 A1 | 7/2017 | Ji et al. | |

FOREIGN PATENT DOCUMENTS

| | | |
|---|---|---|
| CN | 103403214 A | 11/2013 |
| CN | 103730384 A | 4/2014 |
| CN | 105655350 A | 6/2016 |
| CN | 105810137 A | 7/2016 |
| CN | 106771726 A | 5/2017 |
| CN | 110024090 A | 7/2019 |
| JP | H07142736 A | 6/1995 |
| JP | 2011232654 A | 11/2011 |
| JP | 5491947 B2 | 5/2014 |
| KR | 20040100006 A | 12/2004 |

*Primary Examiner* — Karen Kusumakar (57) ABSTRACT

A contact resistance monitoring device, a manufacturing method thereof, and a display panel are provided. The contact resistance monitoring device includes a substrate, a gate metal layer disposed on the substrate, an interlayer dielectric layer disposed on the substrate, a source and drain metal layers disposed in the recessed hole of the interlayer dielectric layer, and a pixel electrode layer disposed on the interlayer dielectric layer and the source and drain metal layer.

18 Claims, 7 Drawing Sheets

CONTACT RESISTANCE MONITORING DEVICE, MANUFACTURING METHOD THEREOF, AND DISPLAY PANEL

This application claims the priority of Chinese Application No. 202010376730.7 filed with the Chinese Patent Office on May 7, 2020 and titled "CONTACT RESISTANCE MONITORING DEVICE, MANUFACTURING METHOD THEREOF, AND DISPLAY PANEL", which is incorporated herein by reference in its entirety.

FIELD OF INVENTION

The present application relates to the field of display technologies, and more particularly to a contact resistance monitoring device, a manufacturing method thereof, and a display panel.

BACKGROUND OF INVENTION

Thin film transistor technologies are widely used in driving circuits of display panels. Thin film transistor includes a gate, a source, and a drain. The drain is electrically connected to a pixel electrode. Electrical conduction between the source and the drain is controlled by a voltage applied to the gate, thereby controlling a working state of the pixel electrode. Therefore, a size of a contact resistance between the drain and the pixel electrode determines power consumption of a driving circuit and a corresponding speed of the pixel electrode.

In the prior art, a viewing angle diffuser film is used to modulate light of a front viewing angle to a large viewing angle, so as to increase the display brightness of the display panel at the large viewing angle. However, this will result in a loss of the display brightness of the front viewing angle of the display panel and substantial reduction in the contrast of the front viewing angle, and an issue of deterioration of display image quality may occur when the display panel is viewed from the front viewing angle.

Figure 1:
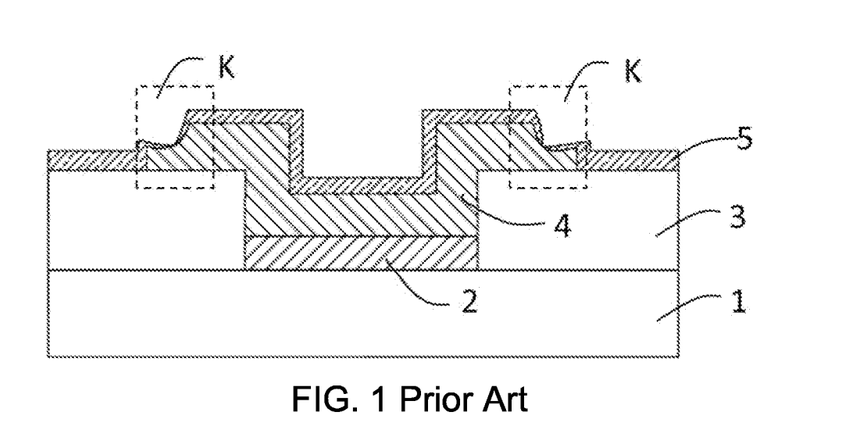
FIG. 1 is a schematic diagram of a structure of a contact resistance monitoring device in the prior art.

In the prior art, a method for testing a contact resistance between the drain of the thin film transistor and the pixel electrode in the display panel is completed by a resistance monitoring device arranged in a non-display area of the display panel. As shown in FIG. 1, the resistance monitoring device in the prior art includes a substrate 1, a gate metal layer 2, an interlayer dielectric layer 3, a source and drain metal layer 4, and a pixel electrode layer 5. The source and drain metal layer 4 is made of a three-layer metal laminate of titanium-aluminum-titanium. During a manufacturing process of the source and drain metal layer 4, etching technology is required. However, an etching speed of metal aluminum is much higher than that of metal titanium, resulting in a formation of a recessed area K on a surface of the source and drain metal layer finally produced. When the pixel electrode layer 5 is continuously fabricated on the source and drain metal layer 4, a fracture of the pixel electrode layer 5 is likely to appear at the recessed area K. This affects conductivity of the pixel electrode layer 5, thereby causing the resistance monitoring device to fail to correctly reflect the contact resistance between the pixel electrode and the drain of the thin film transistor.

Technical Problem:

In the prior art, the source and drain metal layer of the resistance monitoring device of the display panel will have the recessed area during the etching process. When the pixel electrode layer is fabricated on the source and drain metal layer, the pixel electrode layer is likely to form a fracture in the recessed area. This affects conductivity of the pixel electrode layer, causing the resistance monitoring device to fail to work normally.

SUMMARY OF INVENTION

To solve the above technical problem, solutions provided by the present application are as follows:

The present application provides a contact resistance monitoring device, which is applied to monitor a contact resistance between a source and drain metal layer and a pixel electrode layer in a display panel, and is disposed in a non-display area of the display panel. The contact resistance monitoring device comprises a substrate; a gate metal layer disposed on the substrate; an interlayer dielectric layer disposed on the substrate, wherein the interlayer dielectric layer is provided with a recessed hole, and the recessed hole exposes the gate metal layer; the source and drain metal layer disposed in the recessed hole and electrically connected to the gate metal layer; and the pixel electrode layer disposed on the interlayer dielectric layer and the source and drain metal layer, and electrically connected to the source and drain metal layer.

In the contact resistance monitoring device according the present application, a width of the recessed hole is greater than a width of the gate metal layer, such that at least a part of a bottom of the recessed hole is a structure of the interlayer dielectric layer.

In the contact resistance monitoring device according the present application, the source and drain metal layer completely covers the recessed hole.

In the contact resistance monitoring device according the present application, a thickness of the source and drain metal layer is equal to a height of the recessed hole, such that the source and drain metal layer completely fills the recessed hole.

In the contact resistance monitoring device according the present application, a thickness of the source and drain metal layers is less than a height of the recessed hole.

In the contact resistance monitoring device according the present application, the substrate is a rigid substrate or a flexible substrate.

In the contact resistance monitoring device according the present application, the pixel electrode layer is electrically connected to a pixel electrode located in a display area of the display panel.

In the contact resistance monitoring device according the present application, the source and drain metal layer is made of a three-layer metal laminate of titanium-aluminum-titanium.

The present application further provides a manufacturing method of a contact resistance monitoring device, which is applied to monitor a contact resistance between a source and drain metal layer and a pixel electrode layer in a display panel. The manufacturing method comprising the following steps: providing a substrate comprising a display area and a non-display area; forming a gate metal layer on the non-display area of the substrate; forming an interlayer dielectric layer on the substrate, such that the interlayer dielectric layer covers the gate metal layer; forming a recessed hole on the interlayer dielectric layer, such that the gate metal layer is exposed through the recessed hole; forming the source and drain metal layer in the recessed hole, such that the source and drain metal layer is in electrical contact with the gate metal layer; and forming a pixel electrode layer on the interlayer insulating layer, such that the pixel electrode layer covers the interlayer insulating layer and the source and drain metal layer, and is in electrical contact with the source and drain metal layer.

In the manufacturing method of the contact resistance monitoring device according to the present application, forming the gate metal layer on the non-display area of the substrate comprises depositing a first metal layer on the non-display area of the substrate by a physical vapor deposition process; performing an exposure and development process on the first metal layer; and performing an etching process on the first metal layer to form the gate metal layer.

In the manufacturing method of the contact resistance monitoring device according to the present application, material of the first metal layer comprises copper or gold.

In the manufacturing method of the contact resistance monitoring device according to the present application, performing the exposure and development process on the first metal layer comprises first, coating photoresist on the first metal layer; then, exposing and developing the photoresist to remove the photoresist at both ends and leave only a middle part of the photoresist.

In the manufacturing method of the contact resistance monitoring device according to the present application, after performing the etching process on the first metal layer, the method further comprises removing the photoresist on the first metal layer.

In the manufacturing method of the contact resistance monitoring device according to the present application, forming the recessed hole on the interlayer dielectric layer comprises performing an exposure and development process on the interlayer dielectric layer and performing an etching process on the interlayer dielectric layer to form the recessed hole, such that the gate metal layer is exposed through the recessed hole.

In the manufacturing method of the contact resistance monitoring device according to the present application, performing the exposure and development process on the first metal layer comprises first, coating photoresist on the first metal layer; then, exposing and developing the photoresist to remove the photoresist in a middle part and leave only two ends of the photoresist.

In the manufacturing method of the contact resistance monitoring device according to the present application, after performing the exposure and development process on the interlayer dielectric layer, the method further comprises removing the photoresist on the interlayer dielectric layer.

In the manufacturing method of the contact resistance monitoring device according to the present application, forming the source and drain metal layer in the recessed hole comprises depositing a second metal layer on the interlayer dielectric layer and in the recessed hole by a physical vapor deposition process; performing an exposure and development process on the second metal layer; and performing an etching process on the second metal layer to form the source and drain metal layer, and filling the recessed hole with the source and drain metal layer.

The present application further provides a display panel comprising a display area and a non-display area. The non-display area is provided with the above contact resistance monitoring device.

In the display panel according to the present application, the source and drain metal layer in the contact resistance monitoring device completely covers the recessed hole on the interlayer dielectric layer, and a thickness of the source and drain metal layer is equal to a height of the recessed hole.

In the display panel according to the present application, the source and drain metal layer in the contact resistance monitoring device completely covers the recessed hole on the interlayer dielectric layer, and a thickness of the source and drain metal layer is less than a height of the recessed hole.

Beneficial Effect:

In the present application, the source and drain metal layer is disposed in the recessed hole of the interlayer dielectric layer, so as to avoid breakage of the pixel electrode layer caused by a recessed surface of the source and drain metal layer. This helps to ensure accuracy and stability of the contact resistance between the pixel electrode layer and the source and drain metal layer measured by the contact resistance monitoring device.

DESCRIPTION OF DRAWINGS

In order to explain technical solutions in embodiments or the prior art more clearly, the following will briefly introduce drawings that need to be used in the description of the embodiments or the prior art. Obviously, the drawings in the following description are only some embodiments of the present application. For those of ordinary skill in the art, other drawings can be obtained from the drawings without creative work.

DETAILED DESCRIPTION OF PREFERRED EMBODIMENTS

The description of the following embodiments refers to the attached drawings to illustrate specific embodiments that can be implemented in the present application. The directional terms mentioned in the present application, such as "top", "bottom", "front", "back", "left", "right", "inner", "outer", "side", etc., are only the direction of referring to the attached drawings. Therefore, the directional terms used are used to illustrate and understand the present application, rather than to limit the present application. In the figure, units with similar structures are indicated by the same reference numerals.

An embodiment of the present application provides a contact resistance monitoring device, a manufacturing method thereof, and a display panel. The source and drain metal layer of the contact resistance monitoring device is sunkly arranged in the recessed hole of the interlayer dielectric layer. This makes the interlayer dielectric layer and the source and drain metal layer form a relatively flat surface. This is beneficial to maintaining good conductivity of the pixel electrode layer disposed on the interlayer dielectric layer and the source and drain metal layer. This makes the contact resistance between the pixel electrode layer and the source and drain metal layer measured by the contact resistance monitoring device more accurate.

Figure 2:
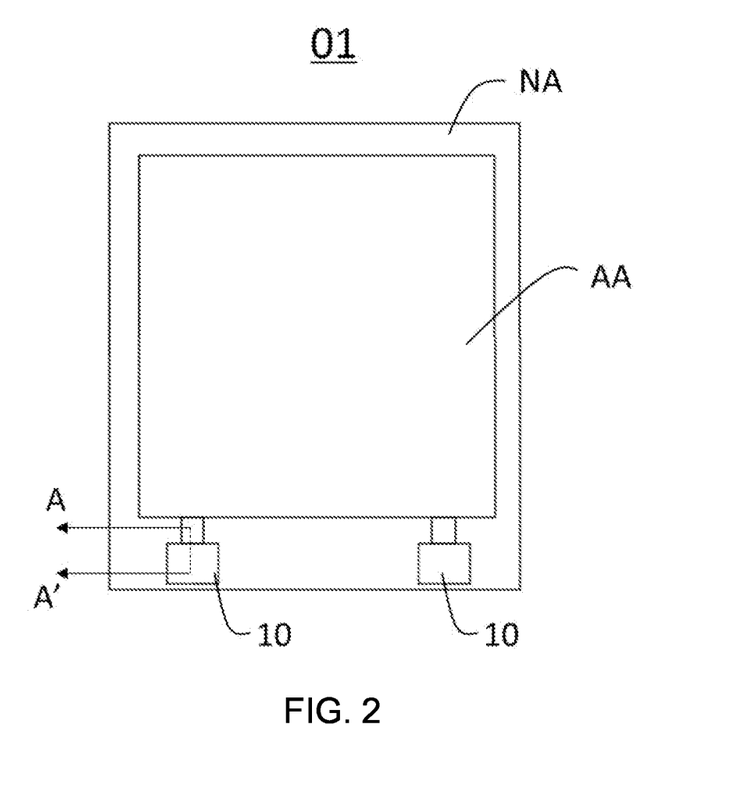
FIG. 2 is a schematic diagram of a planar structure of a display panel provided by an embodiment of the present application.
Figure 3:
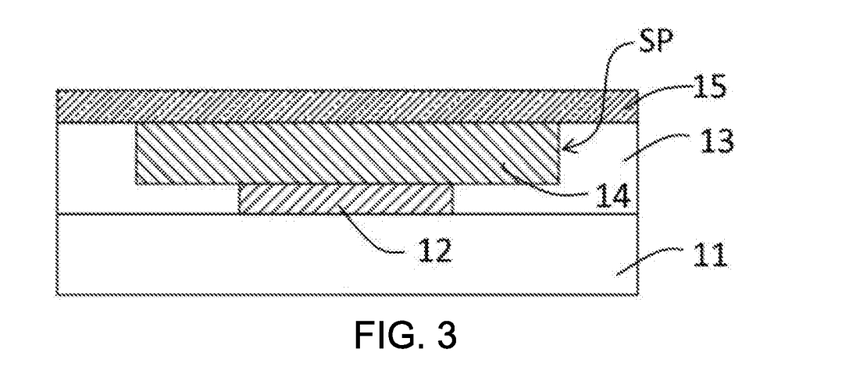
FIG. 3 is a schematic diagram of a first cross-sectional structure of the contact resistance monitoring device in a display panel shown in FIG. 1 along A-A'.
Figure 4:
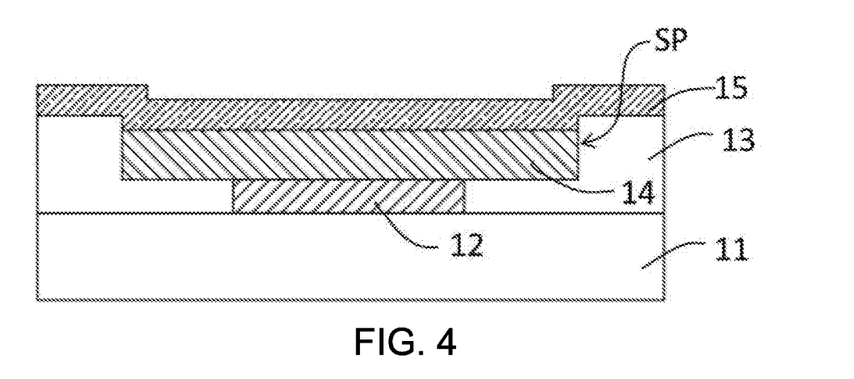
FIG. 4 is a schematic diagram of a second cross-sectional structure of the contact resistance monitoring device in the display panel shown in FIG. 1 along A-A'.

Referring to FIG. 2 to FIG. 4, FIG. 2 is a schematic diagram of a planar structure of a display panel provided by an embodiment of the present application, FIG. 3 is a schematic diagram of a first cross-sectional structure of the contact resistance monitoring device in a display panel shown in FIG. 1 along A-A', and FIG. 4 is a schematic diagram of a second cross-sectional structure of the contact resistance monitoring device in the display panel shown in FIG. 1 along A-A'.

A contact resistance monitoring device 10 provided by an embodiment of the present application is applied to a display panel 01 and is used to monitor a contact resistance between a source and drain metal layer 14 and a pixel electrode layer 15 of the display panel 01. It should be noted that the display panel 01 includes a display area AA and a non-display area NA. The contact resistance monitoring device 10 is disposed in the non-display area NA of the display panel 01. Optionally, the display panel 01 includes at least two contact resistance monitoring devices 10. The two contact resistance monitoring devices 10 are respectively arranged close to opposite sides of the display panel 01, so as to monitor the contact resistance at different positions of the display panel 01 and improve accuracy of monitoring.

Specifically, the contact resistance monitoring device 10 includes a substrate 11, a gate metal layer 12 disposed on the substrate 11, an interlayer dielectric layer 13 disposed on the substrate 11, a source and drain metal layer 14 disposed in a recessed hole of the interlayer dielectric layer 13, and a pixel electrode layer 15 disposed on the interlayer dielectric layer 13 and the source and drain metal layer 14. It should be noted that the contact resistance monitoring device 10 is a microcosm of a thin film transistor structure and a pixel electrode structure inside the display panel 01 in the non-display area NA. That is, the gate metal layer 12, the source and drain metal layer 14, and the pixel electrode layer 15 are respectively made with the same material and process as a gate and a source and drain of the thin film transistor and a pixel electrode inside the display panel 01. This can directly reflect electrical properties of the thin film transistor and pixel electrode inside the display panel 01.

Optionally, the substrate 11 may be a rigid substrate, such as a glass substrate, or a flexible substrate, such as a polyimide substrate.

The gate metal layer 12 and the gate of the thin film transistor inside the display panel 01 are manufactured through the same process and the same process. The gate metal layer 12 may be made of metals such as copper or gold with good conductivity.

The interlayer dielectric layer 13 and an interlayer dielectric structure inside the display panel 01 are manufactured through the same process and the same process. The interlayer dielectric layer 13 has electrical insulation properties, and its material can be silicon oxide, silicon nitride, or the like. The interlayer dielectric layer 13 is provided with a recessed hole SP. The recessed hole SP exposes the gate metal layer 12. The recessed hole SP and an opening on the interlayer dielectric structure inside the display panel 01 are made through the same process. Optionally, in the view angle shown in FIG. 3, a width of the recessed hole SP is greater than a width of the gate metal layer 12. This makes at least a part of a bottom of the recessed hole SP the structure of the interlayer dielectric layer 13 to facilitate subsequent sinking arrangement of the source and drain metal layer 14 in the recessed hole SP.

The source and drain metal layer 14 is disposed in the recessed hole SP and is electrically connected to the gate metal layer 12. Optionally, a thickness of the gate metal layer 14 may be the same as a height of the recessed hole SP, as shown in FIG. 3. The thickness of the gate metal layer 14 may also be smaller than the height of the recessed hole SP, as shown in the structure shown in FIG. 4. It should be noted that the source and drain metal layer 14 is sunkenly disposed in the recessed hole SP. The source and drain metal layer 14 is not provided on the interlayer dielectric layer 13 outside the recessed hole SP. This fundamentally solves an issue of breakage of the pixel electrode caused by recession of the source and drain metal layer on the interlayer dielectric layer outside the recessed hole in the prior art. This is beneficial to ensure stability and accuracy of the contact resistance monitoring by the contact resistance monitoring device 10. Optionally, the source and drain metal layer 14 has a stacked structure of titanium-aluminum-titanium three-layer metal.

The pixel electrode layer 15 is disposed on the interlayer dielectric layer 13 and the source and drain metal layer 14, and is electrically connected to the source and drain metal layer 14. It should be understood that, since the source and drain metal layer 14 is disposed in the recessed hole SP in a sinking manner, the pixel electrode layer 15 may be arranged on a relatively flat surface as a substrate. This greatly reduces risk of the pixel electrode layer 15 being broken.

Optionally, in the view angle shown in FIG. 3, the width of the source and drain metal layer 14 is the same as the width of the recessed hole SP, so that the gate metal layer 14 completely covers the recessed hole SP. Further, the thickness of the source and drain metal layer 14 is the same as the height of the recessed hole SP. This enables the source and drain metal layer 14 to completely sink into the recessed hole SP while completely filling the recessed hole SP, thereby forming a flat surface supporting the pixel electrode layer 15.

Further, the pixel electrode layer 15 is electrically connected to the pixel electrode located in the display area AA of the display panel 01.

To sum up, the source and drain metal layer of the contact resistance monitoring device provided by the embodiments of the present application is sunkly disposed in the recessed hole of the interlayer dielectric layer. This makes the interlayer dielectric layer and the source and drain metal layer form a relatively flat surface. This is beneficial to maintaining good conductivity of the pixel electrode layer disposed on the interlayer dielectric layer and the source and drain metal layer. This makes the contact resistance between the pixel electrode layer and the source and drain metal layer measured by the contact resistance monitoring device more accurate.

Figure 5:
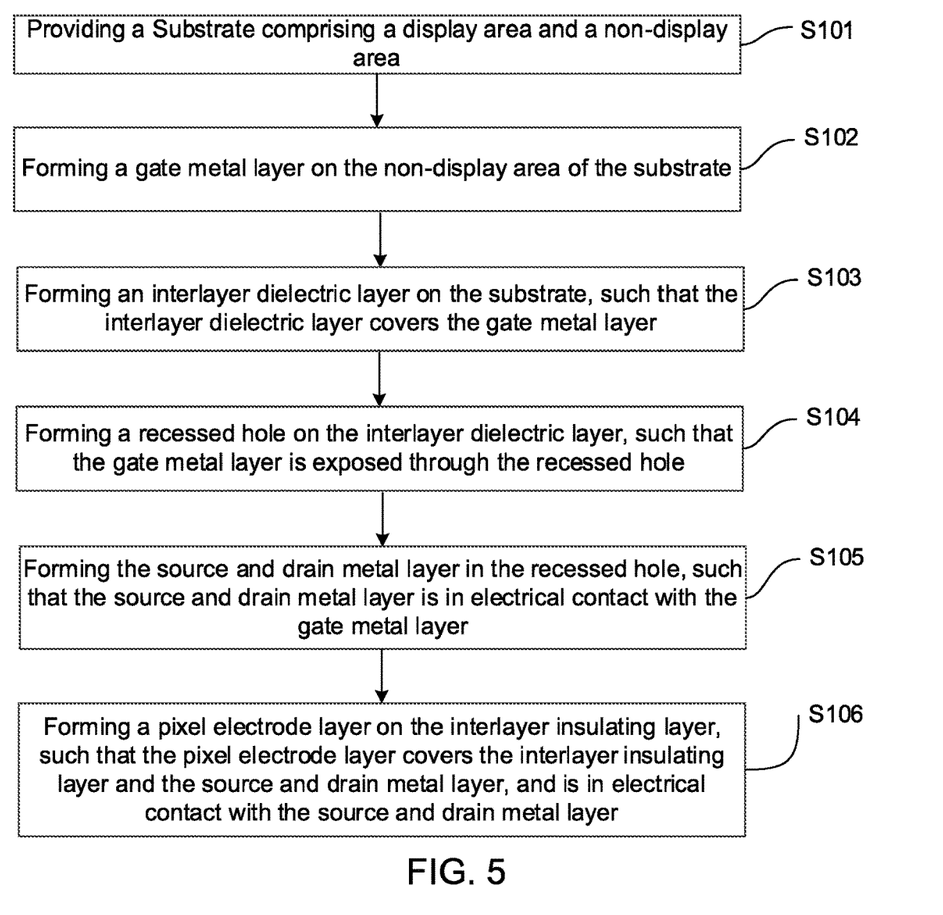
FIG. 5 is a flowchart of a manufacturing method of a contact resistance monitoring device provided by an embodiment of the present application.
Figure 6:
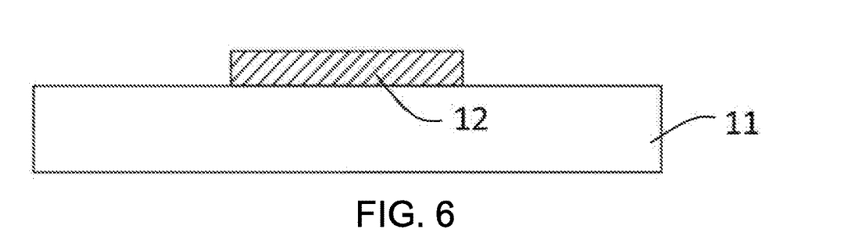
FIG. 6 is a schematic diagram of forming a gate metal layer on a substrate provided by an embodiment of the present application.

An embodiment of the present application further provides a manufacturing method of a contact resistance monitoring device. Referring to FIG. 5, the contact resistance monitoring device is applied to monitor a contact resistance between a source and drain metal layer and a pixel electrode layer in a display panel. The manufacturing method comprising the following steps:

Step S101: providing a substrate 11 comprising a display area and a non-display area as shown in FIG. 6. Optionally, the substrate 11 may be a rigid substrate, such as a glass substrate, or a flexible substrate, such as a polyimide substrate.

Step S102: forming a gate metal layer 12 on the non-display area of the substrate 11.

Figure 6A:
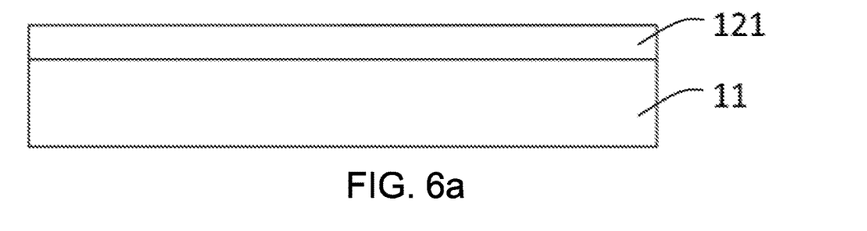
FIG. 6*a* is a schematic diagram of forming a first metal layer on a substrate during a process of forming a gate metal layer.

In detail, forming the gate metal layer 12 on the non-display area of the substrate 11 comprises first, depositing a first metal layer 121 on the non-display area of the substrate 11 through a physical vapor deposition process, as shown in FIG. 6a. The first metal layer 121 may be a conductive metal such as copper or gold.

Figure 6B:
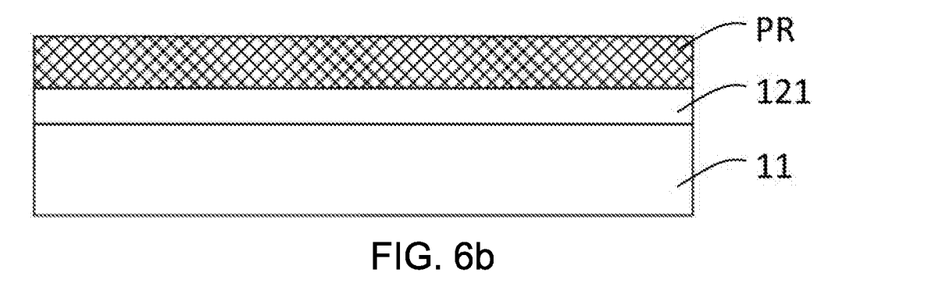
FIG. 6*b* is a schematic diagram of coating photoresist on a first metal layer during a process of forming a gate metal layer.
Figure 6C:
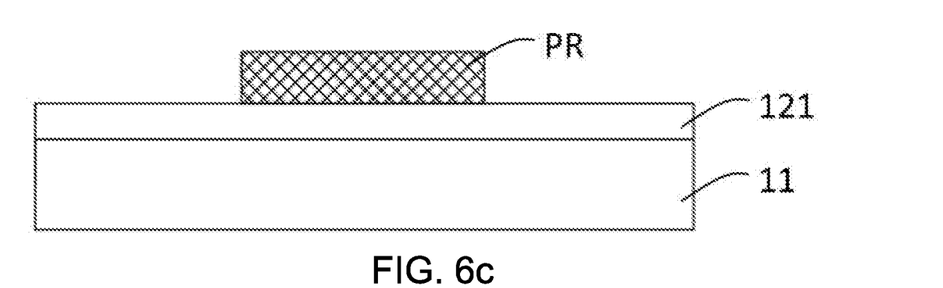
FIG. 6*c* is a schematic diagram of photoresist after exposure and development during a process of forming a gate metal layer.

Then, the first metal layer 121 is exposed and developed. Specifically, photoresist PR is first coated on the first metal layer 121, as shown in FIG. 6b; then the photoresist PR is exposed and developed to remove the photoresist PR at both ends, leaving only a middle part is shown in FIG. 6c.

Finally, an etching process is performed on the first metal layer 121 to form the gate metal layer 12. It should be noted that after the etching process is completed, the remaining photoresist PR is removed.

Figure 7:
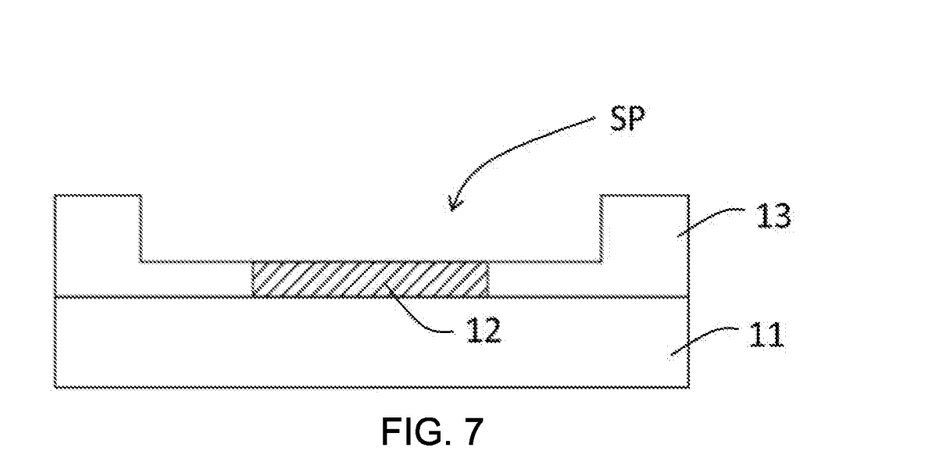
FIG. 7 is a schematic diagram after an interlayer dielectric layer is formed according to an embodiment of the present application.
Figure 7A:
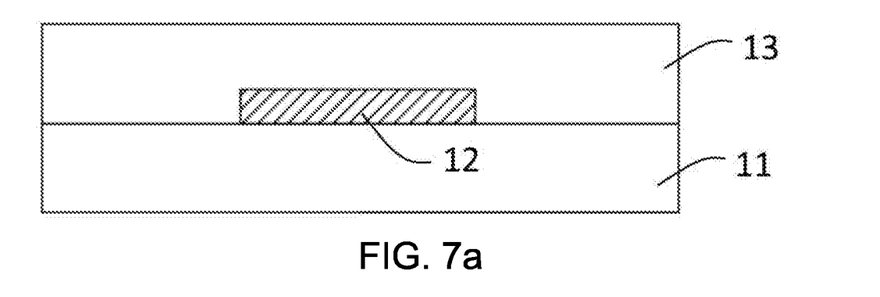
FIG. 7*a* is a schematic diagram of forming an interlayer dielectric layer on a substrate during a process of forming the interlayer dielectric layer.

Step S103: forming an interlayer dielectric layer 13 on the substrate 12 so that the interlayer dielectric layer 13 covers the gate metal layer 12 as shown in FIG. 7a. Optionally, the interlayer dielectric layer 13 may be made of an insulating material such as silicon oxide, silicon nitride, etc., and a method of forming the interlayer dielectric layer 13 may be a chemical vapor deposition method.

Step S104: referring to FIG. 7, forming a recessed hole SP on the interlayer dielectric layer 13, so that the gate metal layer 12 is exposed through the recessed hole SP.

Specifically, the method for forming the recessed hole SP on the interlayer dielectric layer 13 comprises the followings.

Figure 7B:
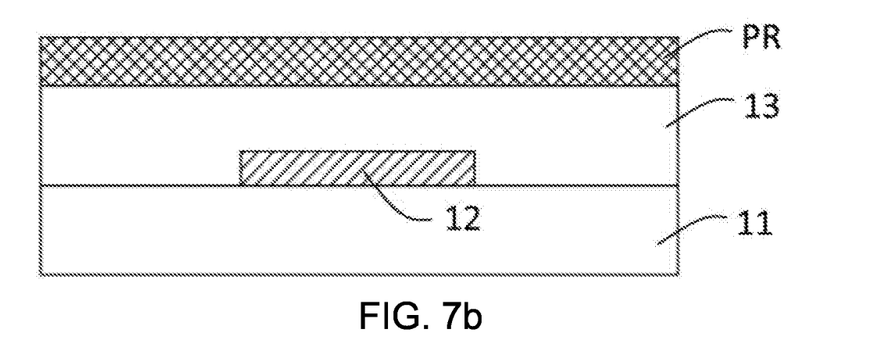
FIG. 7*b* is a schematic diagram of coating photoresist on an interlayer dielectric layer in a process of forming the interlayer dielectric layer.
Figure 7C:
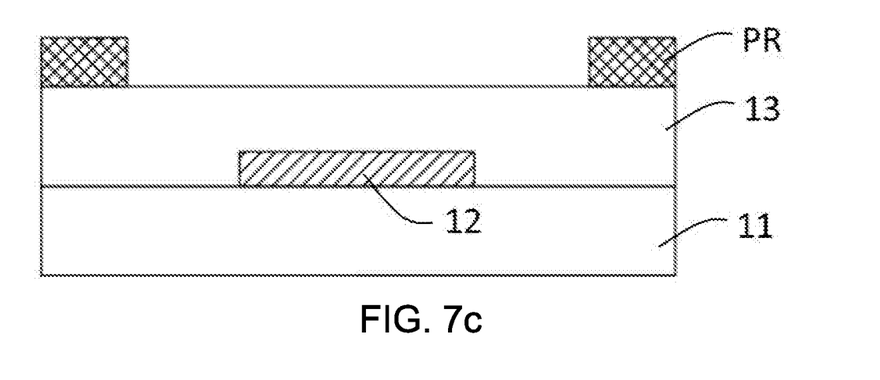
FIG. 7*c* is a schematic diagram of photoresist after exposure and development during a process of forming an interlayer dielectric layer.

First, the interlayer dielectric layer 13 is exposed and developed. Specifically, the photoresist PR is first coated on the interlayer dielectric layer 13, as shown in FIG. 7b; and then the photoresist PR is exposed and developed to remove the photoresist PR in the middle and leave two ends, as shown in FIG. 7c.

Then, an etching process is performed on the interlayer dielectric layer 13 to form the recessed hole SP, and the gate metal layer 12 is exposed through the recessed hole SP. It should be noted that after the etching process is completed, the remaining photoresist PR is removed.

Figure 8:
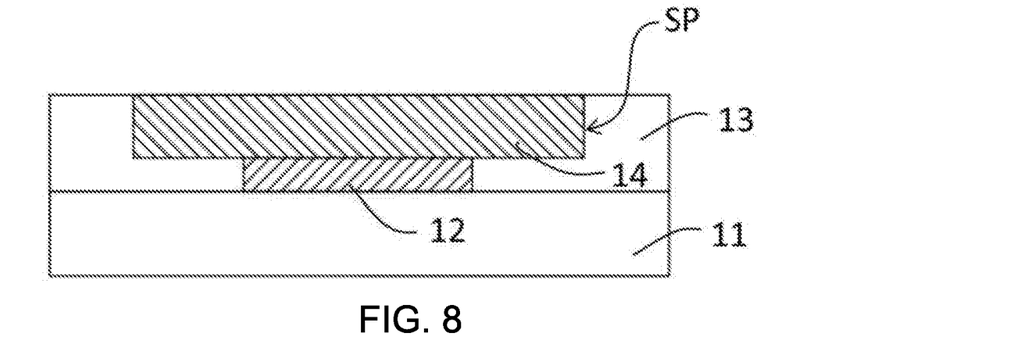
FIG. 8 is a schematic diagram after forming a source and drain metal layer provided by an embodiment of the present application.

Step S105: referring to FIG. 8, forming a source and drain metal layer 14 in the recessed hole SP, wherein the source and drain metal layer 14 is in electrical contact with the gate metal layer 12.

Specifically, the method for forming the source and drain metal layer 14 in the recessed hole SP comprises the followings.

Figure 8A:
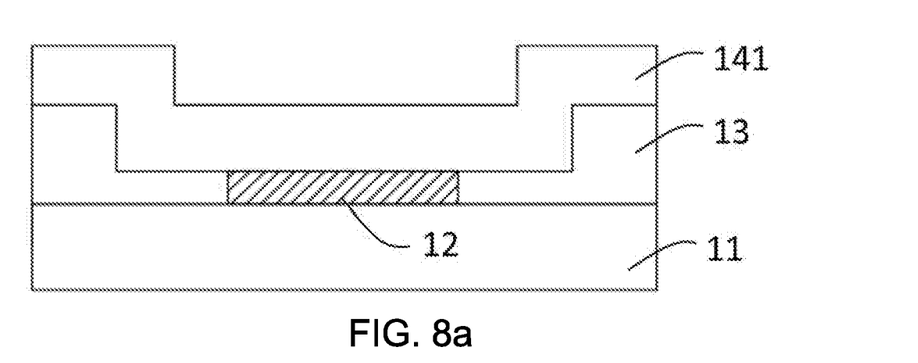
FIG. 8a is a schematic diagram of forming a second metal layer on an interlayer dielectric layer in a process of forming the source and drain metal layer.

First, a second metal layer 141 is deposited on the interlayer dielectric layer 13 and in the recessed hole SP by a physical vapor deposition process, as shown in FIG. 8a.

Figure 8B:
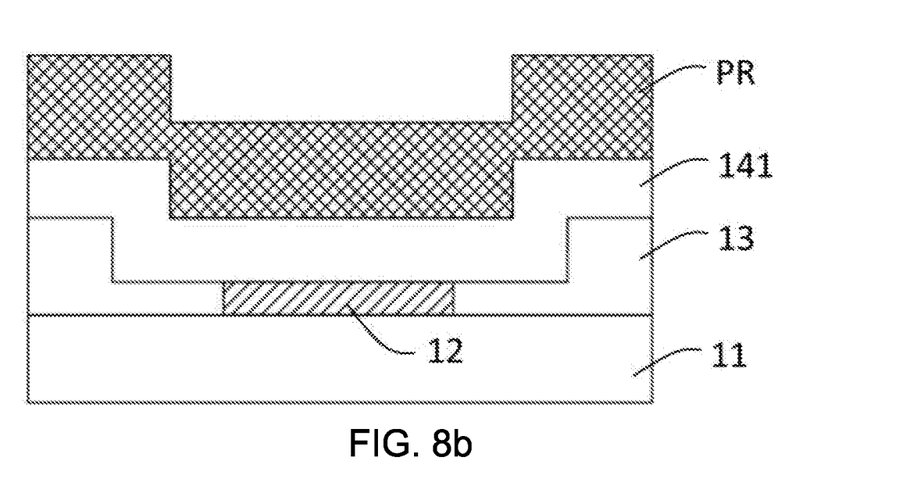
FIG. 8b is a schematic diagram of coating photoresist on a second metal layer in a process of forming a source and drain metal layer.
Figure 8C:
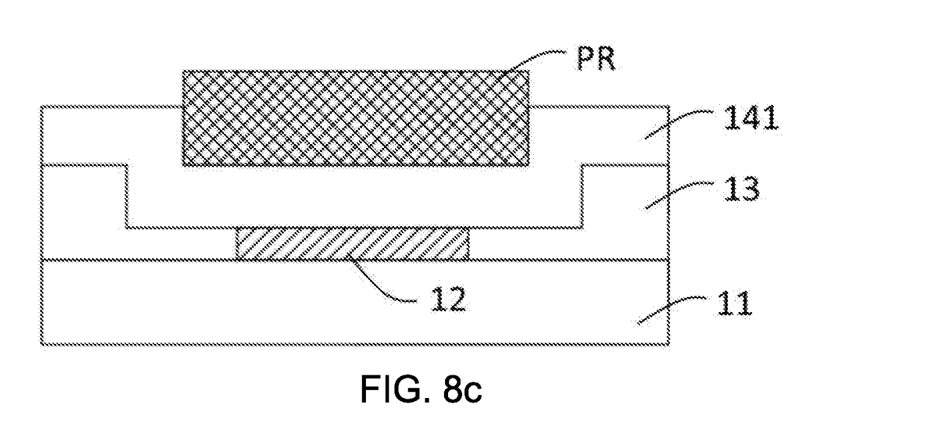
FIG. 8c is a schematic diagram of photoresist after exposure and development during a process of forming a source and drain metal layer.

Then, an exposure and development process is performed on the second metal layer 141. In details, first, a photoresist PR is coated on the second metal layer 141, as shown in FIG. 8b; and then exposure and development operation is performed on the photoresist PR to remove the photoresist PR at both ends and leave only a middle part corresponding to the recessed hole SP, as shown in FIG. 8c.

Finally, an etching process is performed on the second metal layer 141 to form the source and drain metal layer 14, and the source and drain metal layer 14 is filled with the recessed hole SP. It should be noted that after the etching process is completed, the remaining photoresist PR is removed.

Figure 9:
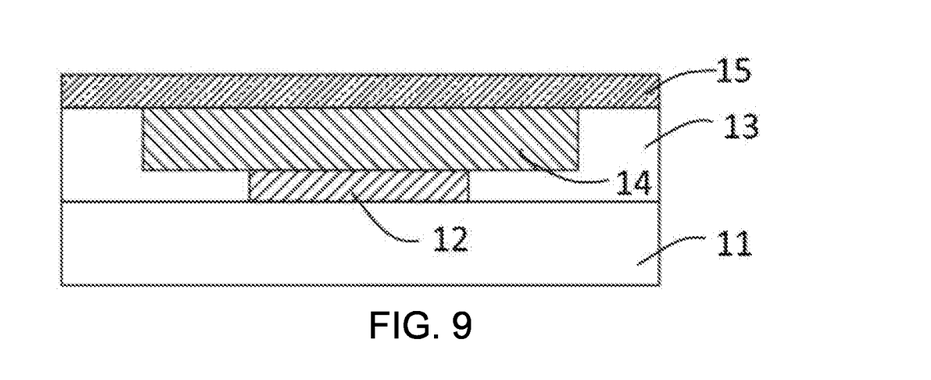
FIG. 9 is a schematic diagram after forming a pixel electrode layer provided by an embodiment of the present application.

Step S106: as shown in FIG. 9, forming a pixel electrode layer 15 on the interlayer insulating layer 13, so that the pixel electrode layer 15 covers the interlayer insulating layer 13 and the source and drain metal layer 14, and is in electrical contact with the source and drain metal layer 14 to form the contact resistance monitoring device.

An embodiment of the present application also provides a display panel, which includes a display area and a non-display area. The non-display area is provided with the contact resistance monitoring device provided by the embodiment of the present application. The display panel provided by the embodiment of the present application can accurately monitor the contact resistance between the source and drain electrode and the pixel electrode in the display panel through the contact resistance monitoring device, and then accurately evaluate a performance of the display panel.

It should be noted that although the present application is disclosed as above in specific embodiments, the above-mentioned embodiments are not intended to limit the present application. Those of ordinary skill in the art can make various changes and modifications without departing from the spirit and scope of the present application. Therefore, the protection scope of the present application is subject to the scope defined by the claims.

What is claimed is:

1. A contact resistance monitoring device, which is applied to monitor a contact resistance between a source and drain metal layer and a pixel electrode layer in a display panel, and is disposed in a non-display area of the display panel, wherein the contact resistance monitoring device comprises:
 a substrate;
 a gate metal layer disposed on the substrate;

an interlayer dielectric layer disposed on the substrate, wherein the interlayer dielectric layer is provided with a recessed hole, and the recessed hole exposes the gate metal layer;
the source and drain metal layer disposed in the recessed hole and electrically connected to the gate metal layer; and
the pixel electrode layer disposed on the interlayer dielectric layer and the source and drain metal layer, and electrically connected to the source and drain metal layer;
wherein a width of the recessed hole is greater than a width of the gate metal layer, such that at least a part of a bottom of the recessed hole is a structure of the interlayer dielectric layer.

2. The contact resistance monitoring device according to claim 1, wherein the source and drain metal layer completely covers the recessed hole.

3. The contact resistance monitoring device according to claim 2, wherein a thickness of the source and drain metal layer is equal to a height of the recessed hole, such that the source and drain metal layer completely fills the recessed hole.

4. The contact resistance monitoring device according to claim 2, wherein a thickness of the source and drain metal layers is less than a height of the recessed hole.

5. The contact resistance monitoring device according to claim 1, wherein the substrate is a rigid substrate or a flexible substrate.

6. The contact resistance monitoring device according to claim 1, wherein the pixel electrode layer is electrically connected to a pixel electrode located in a display area of the display panel.

7. The contact resistance monitoring device according to claim 1, wherein the source and drain metal layer has a stacked structure of titanium-aluminum-titanium three-layer metal.

8. A display panel comprising a display area and a non-display area, wherein the non-display area is provided with a contact resistance monitoring device, wherein the contact resistance monitoring device comprises:
a substrate;
a gate metal layer disposed on the substrate;
an interlayer dielectric layer disposed on the substrate, wherein the interlayer dielectric layer is provided with a recessed hole, and the recessed hole exposes the gate metal layer;
the source and drain metal layer disposed in the recessed hole and electrically connected to the gate metal layer; and
the pixel electrode layer disposed on the interlayer dielectric layer and the source and drain metal layer, and electrically connected to the source and drain metal layer;
wherein the source and drain metal layer in the contact resistance monitoring device completely covers the recessed hole on the interlayer dielectric layer, and a thickness of the source and drain metal layer is equal to a height of the recessed hole.

9. The display panel according to claim 8, wherein the substrate is a rigid substrate or a flexible substrate.

10. The display panel according to claim 8, wherein the pixel electrode layer is electrically connected to a pixel electrode located in a display area of the display panel.

11. The display panel according to claim 8, wherein the source and drain metal layer has a stacked structure of titanium-aluminum-titanium three-layer metal.

12. A display panel comprising a display area and a non-display area, wherein the non-display area is provided with a contact resistance monitoring device, wherein the contact resistance monitoring device comprises:
a substrate;
a gate metal layer disposed on the substrate;
an interlayer dielectric layer disposed on the substrate, wherein the interlayer dielectric layer is provided with a recessed hole, and the recessed hole exposes the gate metal layer;
the source and drain metal layer disposed in the recessed hole and electrically connected to the gate metal layer; and
the pixel electrode layer disposed on the interlayer dielectric layer and the source and drain metal layer, and electrically connected to the source and drain metal layer;
wherein a width of the recessed hole is greater than a width of the gate metal layer, such that at least a part of a bottom of the recessed hole is a structure of the interlayer dielectric layer.

13. The contact resistance monitoring device according to claim 12, wherein the source and drain metal layer completely covers the recessed hole.

14. The contact resistance monitoring device according to claim 13, wherein a thickness of the source and drain metal layer is equal to a height of the recessed hole, such that the source and drain metal layer completely fills the recessed hole.

15. The contact resistance monitoring device according to claim 13, wherein a thickness of the source and drain metal layers is less than a height of the recessed hole.

16. The display panel according to claim 12, wherein the substrate is a rigid substrate or a flexible substrate.

17. The display panel according to claim 12, wherein the pixel electrode layer is electrically connected to a pixel electrode located in a display area of the display panel.

18. The display panel according to claim 12, wherein the source and drain metal layer has a stacked structure of titanium-aluminum-titanium three-layer metal.

* * * * *